United States Patent
Tsuchiya et al.

(10) Patent No.: US 9,379,157 B2
(45) Date of Patent: Jun. 28, 2016

(54) IMAGE ACQUISITION DEVICE, BIOMETRIC AUTHENTICATION DEVICE, AND ELECTRONIC APPARATUS

(75) Inventors: Hitoshi Tsuchiya, Suwa (JP); Hideto Ishiguro, Shiojiri (JP); Tsukasa Eguchi, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 954 days.

(21) Appl. No.: 13/437,228

(22) Filed: Apr. 2, 2012

(65) Prior Publication Data

US 2012/0257031 A1 Oct. 11, 2012

(30) Foreign Application Priority Data

Apr. 7, 2011 (JP) ................................. 2011-085162

(51) Int. Cl.
*H04N 7/18* (2006.01)
*H01L 27/146* (2006.01)
*G06K 9/00* (2006.01)

(52) U.S. Cl.
CPC ........ *H01L 27/14632* (2013.01); *G06K 9/0004* (2013.01); *H01L 27/14618* (2013.01); *H01L 27/14625* (2013.01); *H01L 27/14627* (2013.01); *H01L 2924/0002* (2013.01)

(58) Field of Classification Search
CPC .................. H01L 27/14632; H01L 27/14618; H01L 27/14625; H01L 27/14627; H01L 2924/0002; G06K 9/0004
See application file for complete search history.

(56) References Cited

U.S. PATENT DOCUMENTS

| | | | |
|---|---|---|---|
| 6,781,632 B1* | 8/2004 | Ide ................................. | 348/345 |
| 2004/0184641 A1 | 9/2004 | Nagasaka et al. | |
| 2006/0221637 A1* | 10/2006 | Chikugawa et al. .......... | 362/612 |
| 2011/0001814 A1* | 1/2011 | Yamanaka et al. .............. | 348/78 |
| 2011/0128423 A1* | 6/2011 | Lee et al. ....................... | 348/294 |
| 2011/0235017 A1* | 9/2011 | Iwasaki ................ | H04N 5/2354 356/4.01 |

FOREIGN PATENT DOCUMENTS

| | | |
|---|---|---|
| JP | A-2004-265269 | 9/2004 |
| JP | 2006-088155 A | 4/2006 |
| JP | 2007-279534 A | 10/2007 |
| JP | A-2008-168118 | 7/2008 |
| JP | 2009-043138 A | 2/2009 |
| JP | A-2009-172263 | 8/2009 |
| JP | A-2009-238205 | 10/2009 |

* cited by examiner

Primary Examiner — Tat Chio
(74) Attorney, Agent, or Firm — Oliff PLC (57) ABSTRACT

An image acquisition device includes: an imaging unit which has a plurality of light receiving elements; a condensing unit which condenses light which is input to the light receiving elements, and includes a plurality of microlenses which are arranged one to one with the light receiving elements on a plane; and a band pass filter including amorphous silicon films on a path on which light from an object is input to the light receiving elements.

8 Claims, 5 Drawing Sheets

IMAGE ACQUISITION DEVICE, BIOMETRIC AUTHENTICATION DEVICE, AND ELECTRONIC APPARATUS

BACKGROUND

1. Technical Field

The present invention relates to an image acquisition device, a biometric authentication device, and an electronic apparatus which are suitable for personal authentication by photographing vein patterns of a human body.

2. Related Art

As a technology of performing personal authentication using human biological information, a technology which uses the vein patterns of fingers has been introduced in the ATMs of banks, and has attracted attention. An authentication method using the vein patterns of fingers has no psychological resistance, since it is not associated with a criminal investigation as are fingerprints, nor does it directly irradiate the eyeball with light like iris recognition. In addition, it has an advantage that it is difficult to counterfeit, since it is internal features not a biological surface which can be readily observed.

Such vein patterns of fingers, which are within an organism, are obtained by illuminating the finger with near infrared light which is highly transmissive to an organism, and by photographing the finger using a camera, an image sensor, or the like, which are sensitive to the near infrared light. Since hemoglobin in the blood absorbs the near infrared light well, the light is absorbed in the blood vessels, and is photographed darkly compared to surrounding tissues. A pattern due to the difference between light and dark becomes the vein patterns.

As an example of this type of finger vein authentication device in the related art, for example, an authentication device described in JP-A-2004-265269 is exemplified. The authentication device described in JP-A-2004-265269 photographs the vein patterns of finger by irradiating the finger with the near infrared light from the right and left of the finger which is placed along a guide.

Meanwhile, along with spread of mobile devices, there has been a growing need for conducting financial settlement using mobile devices. For example, a mobile phone has been one financial payment terminal, and as one personal authentication method which is necessary for the financial payment, finger vein authentication has attracted attention. Currently, slimming of the housing of the mobile phone has progressed, in addition, the mobile phone is also used outdoors, it is necessary for a device photographing finger vein patterns which is mounted to the mobile phone to be slim and to have environmental resistance performance.

Regarding the environmental resistance performance to environment, the presence of light other than the near infrared light for photographing, that is, ambient light such as sunlight has a significant impact on the quality of photographed vein patterns. For example, it is a case where the sunlight is radiated to the finger as the photographing target, or the like. In the sunlight, not only visible wavelength, but near infrared wavelength is included, and the light intensity thereof is much larger than the light intensity of the near infrared light source for photographing the vein patterns. Accordingly, when the sunlight is radiated to the finger, the imaging unit is saturated, and the vein patterns become an overexposed image, being affected by the intense visible light which is included in the sunlight, and the near infrared light. Accordingly, it is difficult to perform the authentication.

For solving these problems, an example in which a band pass filter, or a visible light cut filter is built into an optical system is described in JP-A-2008-168118, JP-A-2009-238205, and JP-A-2009-172263. In JP-A-2008-168118, a method is disclosed, in which a microlens substrate also functions as the visible light cut filter, and in JP-A-2009-238205, a method is disclosed in which the visible light cut filter is built into the microlens array. In addition, in JP-A-2009-172263, a method of forming the lens in the band pass filter is disclosed.

However, since the light intensity of the near infrared light included in the sunlight is larger than the light intensity of the near infrared light for photographing the vein patterns, even if the visible light cut filter is used, the imaging unit is saturated, the vein patterns become the overexposed image, accordingly, the inconvenience of authentication becoming disabled may occur.

In addition, in general, since the band pass filter is formed of dielectric multilayer film (interference filter), multilayer film cut filter, or a color glass, the filter itself becomes thick, and the thickness of the device is increased. Further, since the filter is expensive, it leads to an increase in the cost of the device. When the band pass filter is formed of a single dielectric multilayer film, the thickness is not increased. However, sub-transmission bands occur at both sides of transmission center wavelength, and the visible light is transmitted. Due to this, the imaging unit is saturated, the vein patterns become the overexposed image, and as a result, the inconvenience of authentication becoming disabled occurs.

SUMMARY

The invention can be realized in the following forms or application examples.

Application Example 1

An image acquisition unit according to the application example includes, an imaging unit having a plurality of light receiving elements; a condensing unit which condenses light which is input to the light receiving element, and includes a plurality of microlenses which are arranged one to one with the light receiving element on a plane; and a band pass filter including amorphous silicon films on the path on which light from an object is input to the light receiving element.

According to the application example, since the amorphous silicon films has a large absorption in the visible region, in the sub-transmission bands which appear when the band pass filter is configured by a single dielectric multilayer (appears at both sides of the transmission center wavelength), it is possible to reliably suppress the sub-transmission bands in the visible region. Due to this, it is possible to sufficiently limit the transmission band without using the multilayer cut filter, or the color glass. Accordingly, by including the band pass filter having amorphous silicon films, it is possible to avoid the inconvenience in which the imaging unit is saturated, the vein patterns become the overexposed image, and the authentication is disabled. In addition, since the multilayer cut filter, or the color glass is not necessary, it is possible to make the image acquisition device slim, and at low cost.

Application Example 2

The image acquisition device which is described in the above application example includes a light shielding unit which is arranged between the imaging unit and the condensing unit, and prevents light beam crosstalk between the microlenses which are adjacent to each other is provided, in which the band pass filter is built into at least one of the imaging unit, the condensing unit, and the light shielding unit.

According to the application example, since the band pass filter including the amorphous silicon is built into at least one of the imaging unit, the condensing unit, and the light shielding unit, it is possible to realize a slimmer shape in the above described image acquisition device.

Application Example 3

The image acquisition device which is described in the above application example includes a light source which irradiates the object with light.

According to the application example, it is possible to photograph vein patterns in a room or the like, since the light source which irradiates the object with light is included.

Application Example 4

In the image acquisition device which is described in the above application example, an emission peak wavelength of the light source and a transmission peak wavelength of the band pass filter match each other.

According to the application example, since the emission peak wavelength of the light source and the transmission peak wavelength of the band pass filter including the amorphous silicon match each other, it is possible to suppress a decrease in the light intensity of the input light to the light receiving element by being provided with the band pass filter including the amorphous silicon, when photographing the vein patterns using the light source. Accordingly, it is possible to photograph the vein patterns in any case where the light source is used in a room, or the like, or where the sunlight is radiated to the finger. In addition, according to the invention, the "match" of the emission peak wavelength and the transmission peak wavelength implies a case where numerical values of both substantially match each other (equal to a case where the numerical values of both match each other), in addition to a case where the numerical values of both completely match each other. For example, even when the emission peak wavelength and the transmission peak wavelength are formally different from each other, it is considered that both substantially match each other, for example, when the difference of both is within a manufacturing error (that is, belongs to the scope of the invention). The configuration in which the emission peak wavelength and the transmission peak wavelength completely match each other is exceptionally effective configuration, however, it is not an essential configuration when considering the desired effect of suppressing the decrease of light intensity of input light to the light receiving element.

Application Example 5

In the image acquisition device which is described in the above application example, the band pass filter is configured by two mirror layers and a spacer layer which is pinched by the two mirror layers, in which the mirror layer has a structure in which the amorphous silicon thin films which have an optical path length of approximately $\lambda/4$ each other in the center wavelength ($\lambda$) of the light source, and a thin film which is formed of a material with a different refractivity from the amorphous silicon films are alternately laminated, and the spacer layer is the amorphous silicon thin film which has optical path length of approximately $\lambda/2$ in the center wavelength ($\lambda$) of the light source, or a thin film which is formed of a material with a different refractivity from the amorphous silicon films.

According to the application example, the transmission peak wavelength matches the emission peak wavelength of the light source, and realizes the band pass filter in which the occurrence of the sub-transmission bands in the visible region (which appears at both sides of the transmission center wavelength) is suppressed. Accordingly, it is possible to photograph suitable vein patterns in any case where the light source is used in a room, or the like, or where the sunlight is radiated to the finger outdoors.

Application Example 6

In the image acquisition device which is described in the above application example, the band pass filter is configured by two mirror layers and a spacer layer which is pinched by the two mirror layers, in which the mirror layer has a structure in which the amorphous silicon thin films which have an optical path length of approximately $(\lambda 2)/4$ each other in a wavelength ($\lambda 2$) which is shorter than the center wavelength ($\lambda$) of the light source, and a thin film which is formed of a material with a different refractivity from the amorphous silicon films are alternately laminated, and the spacer layer is the amorphous silicon thin film which has optical path length of approximately $(\lambda 3)/2$ in a wavelength ($\lambda 3$) which is longer than the center wavelength ($\lambda$) of the light source, or a thin film which is formed of a material with a different refractivity from the amorphous silicon films.

According to the application example, the transmission peak wavelength matches the emission peak wavelength of the light source, and realizes the band pass filter in which the occurrence of the sub-transmission bands in the visible region (which appears at both sides of the transmission center wavelength) is further suppressed. Accordingly, it is possible to photograph more suitable vein patterns in any case where the light source is used in a room, or the like, or where the sunlight is radiated to the finger outdoors.

Application Example 7

In the image acquisition device which is described in the above application example, the band pass filter has a structure in which the amorphous silicon thin film and a thin film which is formed of a material with a different refractivity from the amorphous silicon films are alternately laminated by odd number layers ($2n+1$, $n=2, 3, \ldots$ ), and the optical path length of the band pass filter other than the $n+1$th layer is approximately $(\lambda 5)/4$ in a wavelength ($\lambda 5$) which is shorter than the center wavelength ($\lambda$) of the light source, and the optical path length of the $n+1$th layer is smaller than the approximate $(\lambda 5)/4$ in the wavelength ($\lambda 5$) which is shorter than the center wavelength ($\lambda$) of the light source.

According to the application example, the transmission peak wavelength matches the emission peak wavelength of the light source, and realizes the band pass filter in which the occurrence of the sub-transmission bands in the visible region (which appears at both sides of the transmission center wavelength) is further suppressed. Accordingly, it is possible to photograph more suitable vein patterns in any case where the light source is used in a room, or the like, or where the sunlight is radiated to the finger outdoors.

Application Example 8

A biometric authentication device according to the application example which obtains human biological information, and performs personal authentication includes the image acquisition device which is described in the above application example.

According to the application example, since an image acquisition device which is able to photograph vein patterns indoors and outdoors, it is possible to perform personal authentication in any environment.

Application Example 9

An electronic apparatus according to the application example includes the biometric authentication device which is described in the application example.

According to the application example, since it is possible to perform the personal authentication using the vein patterns regardless of the inside and outside of a building, it is possible to conveniently perform, for example, releasing the locked state of an electronic apparatus, logging in to the electronic apparatus, or the like, in any environment.

BRIEF DESCRIPTION OF THE DRAWINGS

The invention will be described with reference to the accompanying drawings, wherein like numbers reference like elements.

FIG. 7A is a block diagram.

DESCRIPTION OF EXEMPLARY EMBODIMENTS

First Embodiment

Hereinafter, an image acquisition device according to a first embodiment will be described with reference to drawings. In addition, in all of drawings below, the size and ratio of each component is appropriately differentiated from actual size and ratio, since each component has the size to be recognized on the drawings.

Figure 1:
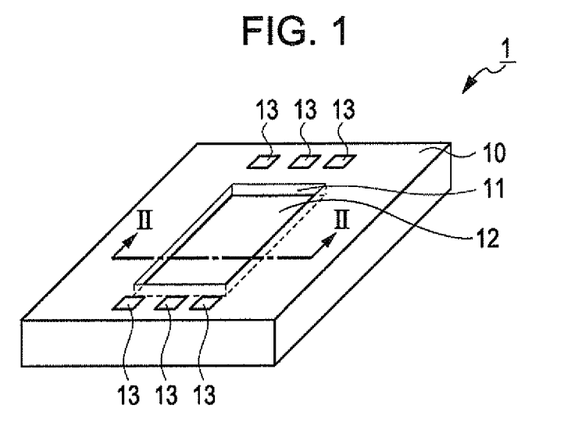
FIG. 1 is a perspective view of an image acquisition device according to a first embodiment.

FIG. 1 is a perspective view of an image acquisition device 1 according to the embodiment. The image acquisition device 1 according to the embodiment has a housing 10, and an opening 11 on the top face of the housing 10, and is provided with an image acquisition unit 12 at a position corresponding to the opening 11. The opening 11 is formed of a size which is covered with a finger, when the finger as the photographing target (not shown) is placed so as to come into contact with the top portion of the housing 10. In addition, it is also possible to provide a finger guide so that there is no individual difference when covering the opening 11 with the finger.

When covering the opening 11 with a finger, a light source 13 of which emission peak wavelength radiated to the finger as the photographing target is 850 nm is provided at the same position which is covered by the finger. As the light source 13, it is possible to use an LED (light emitting diode), an LD (laser diode), an organic EL (electroluminescence) element, or the like. The light which is emitted from the light source 13 is desirably near infrared light, particularly, near infrared light of which wavelengths are approximately in a range of 700 nm to 900 nm. The near infrared light of which wavelengths are approximately in a range of 700 nm to 900 nm has a wavelength range which is referred to as a "biological window" in general, and easily transmits body tissues. On the other hand, since the near infrared light of which wavelengths are approximately in a range of 700 nm to 900 nm is easily absorbed to reduced hemoglobin which is included in the blood flowing through the vein, it is possible to photograph clearer vein patterns compared to a case where a light source of other wavelengths is used.

In FIG. 1, the light source 13 radiates light from the bottom toward the top, that is, toward the finger from the image acquisition device 1, however, this is only an example. It is also possible to radiate the finger by providing a finger guide at a position where the light is radiated from the side of the finger, that is, in the image acquisition device 1, and by arranging the light source 13 in the finger guide. In addition, six light sources 13 are present in FIG. 1, however, the number is not limited to six. It is possible to photograph vein patterns of high quality, by arranging more than 6 light sources 13, increasing the light intensity for photographing, and irradiating the range to be photographed with more uniform light intensity.

Figure 2:
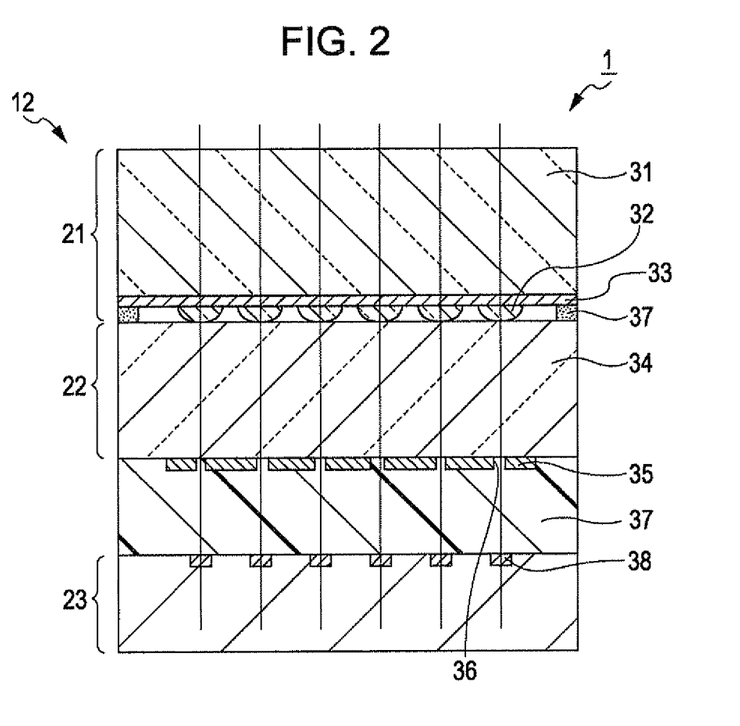
FIG. 2 is a schematic view which shows a cross-section of an image acquisition unit according to the first embodiment.

FIG. 2 is a schematic cross-sectional view taken along line II-II of the image acquisition device 1 in FIG. 1, that is, a diagram which schematically shows a cross-section of an image acquisition unit 12. As shown in FIG. 2, the image acquisition unit 12 is configured by a light shielding unit 22 which is formed of a transparent support medium 34, a light shielding layer 35, an opening 36, an imaging unit 23 which includes a plurality of light receiving elements 38, and a condensing unit 21 which is formed of a transparent support medium 31, a band pass filter 33, and a plurality of microlenses 32, and is integrated by an adhesion layer 37. The condensing unit 21 and the light shielding unit 22 are arranged with a predetermined gap, and the adhesion layer 37 is provided at the outer periphery of a region where the plurality of microlenses 32 is formed. Similarly, the light shielding unit 22 and the imaging unit 23 are arranged with a predetermined gap, and the adhesion layer 37 is filled between both the substrates.

The light shielding unit 22 is configured by the transparent support medium 34, the light shielding layer 35, and the opening 36, and the transparent support medium 34 is formed of a material which is transparent to the near infrared light such as glass, quartz, or the like. The light shielding layer 35 functions as a near infrared light absorbing layer, and is formed of a resin material in which light absorbing material is mixed, Cr, or the like. The opening 36 is formed by partially removing the light shielding layer 35 using a photolithographic technique, or the like.

In addition, as a configuration of the light shielding unit 22, it is possible to use a partition wall of a certain height with an opening which is formed of a resin material mixed with the light absorbing material, in addition to the light shielding layer 35 with the opening 36.

The imaging unit 23 is provided with the plurality of light receiving elements 38, and is able to use a general CMOS image sensor, or a CCD image sensor.

The condensing unit 21 is a unit in which the microlenses 32 are arranged in a planar array on the transparent support medium 31 which is formed of glass, quartz, or the like, and the band pass filter 33, however, it is possible to use a spherical lens, or an aspherical lens as the microlens 32. It is possible to improve optical characteristics by adopting the aspherical lens. As a detailed method of creating the microlens 32, it is possible to use processing methods such as a reflow method, an area tone mask method, and a polishing method, or a molding method in which a mold which is created using those processing methods, or the like is used. As a material thereof, it is possible to use a transparent resin, glass, or the like.

Figure 3:
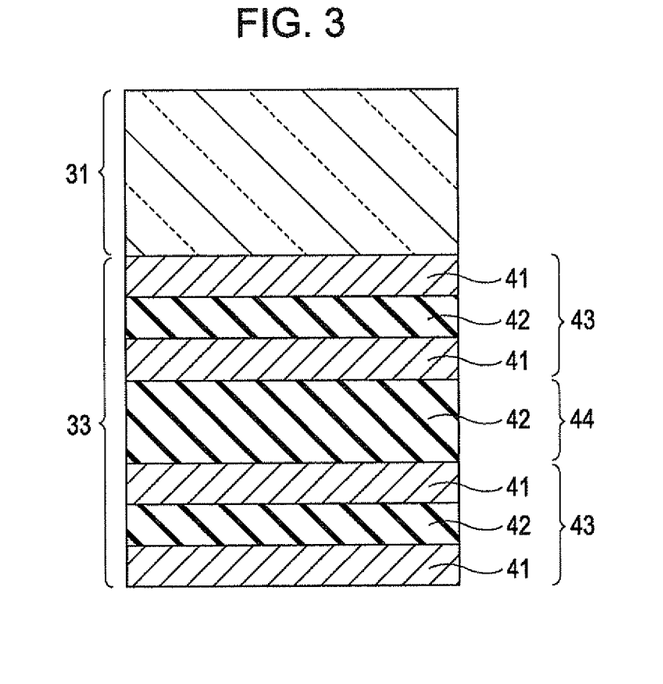
FIG. 3 is a schematic view which shows a configuration of a band pass filter according to the first embodiment.

FIG. 3 is a schematic diagram which shows a configuration of the band pass filter 33. As shown in FIG. 3, the band pass filter 33 is a thin film laminated body of an amorphous silicon (a-Si) thin film 41 formed on the transparent support medium 31 which is formed of glass, quartz, or the like, and silicon dioxide ($SiO_2$) thin film 42.

As is generally known, the band pass filter which is formed of the thin film laminated body has a basic structure in which a spacer layer of which optical path length is $\lambda/2$ is provided on the mirror layer of a pair of a high refractive index layer of which optical path length is $\lambda/4$ and a low refractive index layer, and the mirror layer is laminated thereon by being reversed. The band pass filter 33 according to the embodiment also has the same structure. The mirror layer 43 has a structure in which the a-Si thin films 41 as the high refractive index layer, and of which the optical path length is approximately $\lambda/4$ for both, in the emission peak wavelength ($\lambda$) 850 nm of the light source 13, and the $SiO_2$ thin film 42 as the low refractive index layer are alternately laminated. The spacer layer 44 is the $SiO_2$ thin film 42 of which the optical path length is approximately $\lambda/2$, in the emission peak wavelength ($\lambda$) 850 nm of the light source 13.

Specifically, the mirror layer has a configuration of seven layers of a-Si(54.0 nm), $SiO_2$(143.4 nm), a-Si(54.0 nm), $SiO_2$ (286.9 nm), a-Si(54.0 nm), $SiO_2$(143.4 nm), a-Si(54.0 nm) which are laminated from the transparent support medium 31 side in this order, in which the numbers in parentheses are the film thickness of the a-Si thin films 41 and the $SiO_2$ thin film 42. In addition, the refractivity of the a-Si is 3.935, and the refractivity of the $SiO_2$ is 1.482 in 850 nm. Further, the optical path length of the spacer layer 44 is denoted by the product of the film thickness of the thin film and the refractivity.

The photographing order of the vein patterns according to the embodiment is as follows. When photographing, the finger is placed on the opening 11 of the top face of the housing 10 so as to cover the light source 13, and the near infrared light which is radiated from the light source 13 is input to the finger. The input near infrared light is scattered and propagated in the finger. At this time, the near infrared light is absorbed in the blood of the vein, however, the others are transmitted. Accordingly, it is possible to photograph the vein patterns by receiving the near infrared light which is radiated to the opening 11 in the plurality of light receiving elements 38.

The near infrared light which is radiated to the opening 11 transmits the transparent support medium 31, the band pass filter 33, the microlens 32, the transparent support medium 34, the opening 36, and the adhesion layer 37 in this order, and is input to the light receiving elements 38. In addition, as shown in FIG. 2, the light receiving elements 38, the opening 36, and the microlens 32 are arranged on the same axis, the near infrared light which is radiated to the opening 11 proceeds to the light receiving elements 38 while performing convergence by being affected by the operation of lens on the lens surface of the microlens 32. At this time, the light shielding layer 35 and the opening 36 suppress crosstalk of light which has transmitted each of the microlenses 32 of the condensing unit 21, and contributes to photographing of clear vein patterns.

Figure 4:
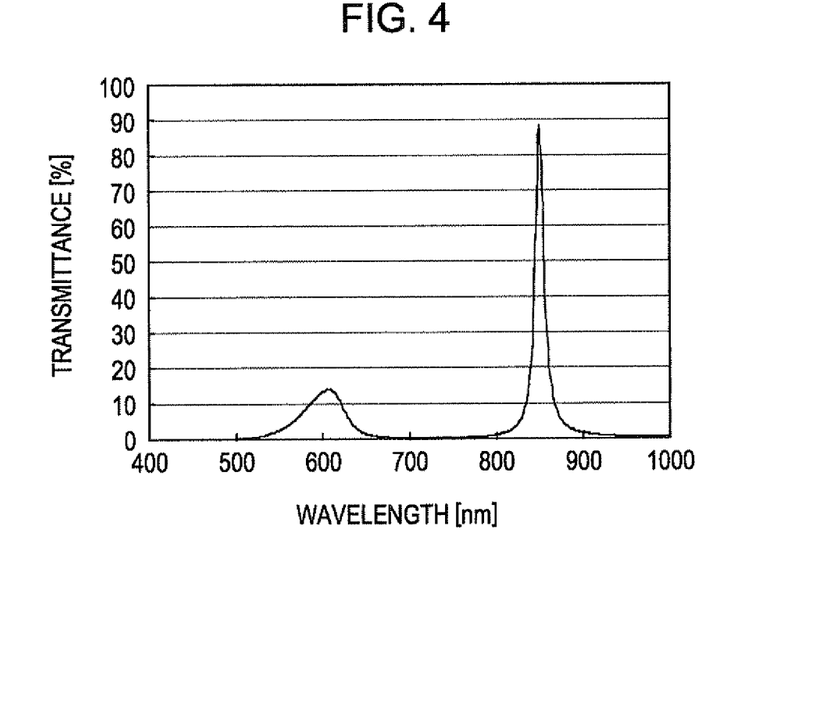
FIG. 4 is a view which shows a wavelength and transmittance characteristics of the band pass filter according to the first embodiment.

FIG. 4 is a diagram which shows the wavelength and the transmission characteristics of the band pass filter which is used in the embodiment. As shown in the drawing, since the emission peak wavelength 850 nm of the light source 13 and the transmission peak wavelength of the band pass filter 33 match each other, it is possible to suppress the deterioration of the intensity of input light to the light receiving elements 38 due to the presence of the band pass filter 33, when photographing the vein patterns using the light source 13. Accordingly, it is possible to photograph the vein patterns using the light source 13 as lighting in a room or the like.

As is known in general, the a-Si has a large absorption in the visible range. For this reason, it is possible to reliably suppress the sub-transmission bands in the visible region among the sub-transmission bands (which occurs at both sides of the transmission peak wavelength) which appears when the band pass filter 33 is configured only by the dielectric multilayer film. Due to this, it is possible to sufficiently limit the transmission band without using the multilayer cut filter, or the color lens, since the sub-transmission bands in the visible region can be reliably suppressed in the sub-transmission bands (which appears at both sides of the transmission peak wavelength) which appear when configuring the band pass filter 33 with a single dielectric multilayer. Accordingly, it is possible to avoid the inconvenience in which the imaging unit 23 is saturated, the vein patterns become the overexposed image, and the authentication is disabled. Due to this, in any case where the light source 13 is used as the lighting in a room or the like, or where the sunlight is radiated to the finger outside a room, it is possible to photograph suitable vein patterns.

In addition, since the multilayer cut filter, or the color lens is not necessary, it is possible to manufacture the image acquisition device 1 at low cost. Further, according to the embodiment, since the band pass filter 33 is formed on the transparent support medium 31 of the condensing unit 21, the increase in thickness of the image acquisition device 1 due to the presence of the band pass filter 33 can be substantially avoided.

Second Embodiment

Subsequently, an image acquisition device according to a second embodiment will be described. The image acquisition device according to the second embodiment has the same basic configuration as that of the image acquisition device 1 according to the first embodiment. The difference from the image acquisition device 1 is that the thickness of an a-Si thin film 41 and $SiO_2$ thin film 42 which configure a band pass filter 33 of an image acquisition unit 12 is different. Accordingly, the perspective view of the image acquisition device 1 and a cross-sectional view of the image acquisition unit 12 are the same in FIGS. 1 and 2, and a schematic view which shows a configuration of the band pass filter 33 is the same as FIG. 3. According to the embodiment, constituent elements which are common to the first embodiment are given the same reference numerals, and detailed description will be omitted.

The band pass filter 33 according to the embodiment is configured by two mirror layers 43, and a spacer layer 44 which is pinched by the two mirror layers 43. The mirror layers 43 has a structure in which the a-Si thin films 41 of which the optical path length is approximately $\lambda/4$ for both, in the emission peak wavelength of 700 nm, which is shorter than the emission peak wavelength ($\lambda$) 850 nm of the light source 13, and the $SiO_2$ thin film 42 are alternately laminated. A spacer layer 44 is the $SiO_2$ thin film 42 of which the optical path length is approximately $\lambda/2$, in the emission peak wavelength of 960 nm which is longer than the emission peak wavelength 850 nm of the light source 13.

Specifically, the mirror layer has a configuration of seven layers of a-Si(41.8 nm), $SiO_2$(117.8 nm), a-Si(41.8 nm), $SiO_2$ (325 nm), a-Si(41.8 nm), $SiO_2$(117.8 nm), a-Si(41.8 nm) which are laminated from the transparent support medium 31 side in this order, in which the numbers in parentheses are film thickness of the a-Si thin films 41, or the $SiO_2$ thin film 42. In addition, the refractivity of the a-Si is 4.187, the refractivity of the $SiO_2$ is 1.486 in 700 nm, and the refractivity of the $SiO_2$ is 1.477 in 960 nm.

Figure 5:
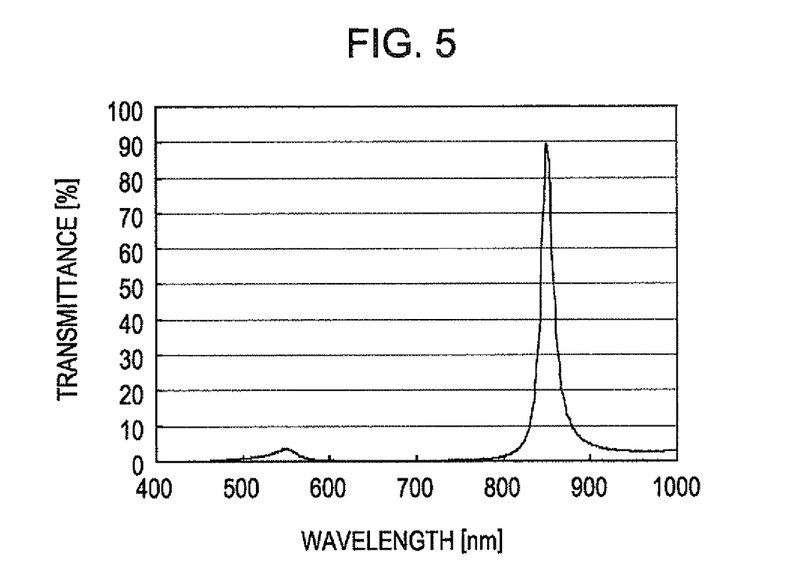
FIG. 5 is a view which shows a wavelength and transmittance characteristics of a band pass filter according to a second embodiment.

FIG. 5 is a diagram which shows the wavelength and the transmittance characteristics of the band pass filter which is used in the embodiment. As shown in the drawing, since the emission peak wavelength ($\lambda$) 850 nm of the light source 13 and the transmission peak wavelength of the band pass filter 33 match each other. Accordingly, it is possible to obtain the same effect as that of the first embodiment, that is, it is possible to suppress the deterioration of the intensity of input light to the light receiving elements 38 due to the presence of the band pass filter 33, when photographing the vein patterns using the light source 13. Therefore, it is possible to photograph the vein patterns using the light source 13 as lighting in a room or the like.

In addition, similarly to the first embodiment, the band pass filter 33 according to the embodiment also includes the a-Si thin film 41 which has a large absorption in the visible range. Further, it is understood that the sub-transmission bands in the visible region can be further reliably suppressed compared to that in the first embodiment, in the sub-transmission bands (which appears at both sides of the transmission peak wavelength) which appear when configuring the band pass filter 33 with a single dielectric multilayer, by adjusting the film thickness of the a-Si thin film 41 and the $SiO_2$ thin film 42 as described above. Accordingly, it is possible to avoid the inconvenience in which the imaging unit 23 is saturated, the vein patterns become an overexposed image, and an authentication is disabled, when the finger is radiated to the sunlight. Due to this, in any case where the light source 13 is used as the lighting in a room or the like, or where the sunlight is radiated to the finger outside a room, it is possible to photograph further suitable vein patterns.

Third Embodiment

Subsequently, an image acquisition device according to a third embodiment will be described. The image acquisition device according to the third embodiment has the same basic configuration as that of the image acquisition device 1 according to the first embodiment. The difference from the image acquisition device 1 is that the thickness of an a-Si thin film 41 and $SiO_2$ thin film 42 which configure the band pass filter 33 of the image acquisition unit 12 is different. Accordingly, the perspective view of the image acquisition device 1 and a cross-sectional view of the image acquisition unit 12 are the same in FIGS. 1 and 2, and a schematic view which shows a configuration of the band pass filter 33 is the same as FIG. 3. According to the embodiment, constituent elements which are common to the first embodiment are given the same reference numerals, and detailed description will be omitted.

The band pass filter 33 according to the embodiment has a structure in which an a-Si thin film 41 and an $SiO_2$ thin film 42 are alternately laminated by odd numbers (2n+1 n=2, 3, and the optical path length of the band pass filter 33 other than n+1th layer is approximately $\lambda/4$, in the emission peak wavelength of 700 nm which is shorter than the emission peak wavelength ($\lambda$) 850 nm of the light source 13. On the other hand, the optical path length of the n+1th layer is smaller than $\lambda/4$, in the emission peak wavelength of 700 nm which is shorter than that of the light source 13.

Specifically, the band pass filter has a configuration of seven layers of a-Si(41.8 nm), $SiO_2$(117.8 nm), a-si(41.8 nm), $SiO_2$(38 nm), a-Si(41.8 nm), $SiO_2$(117.8 nm), a-Si(41.8 nm) which are laminated from the transparent support medium 31 side in this order, in which the numbers in parentheses are film thickness of the a-Si thin films 41, or the $SiO_2$ thin film 42. In addition, the refractivity of the a-Si is 4.187, and the refractivity of the $SiO_2$ is 1.486 in 700 nm.

Figure 6:
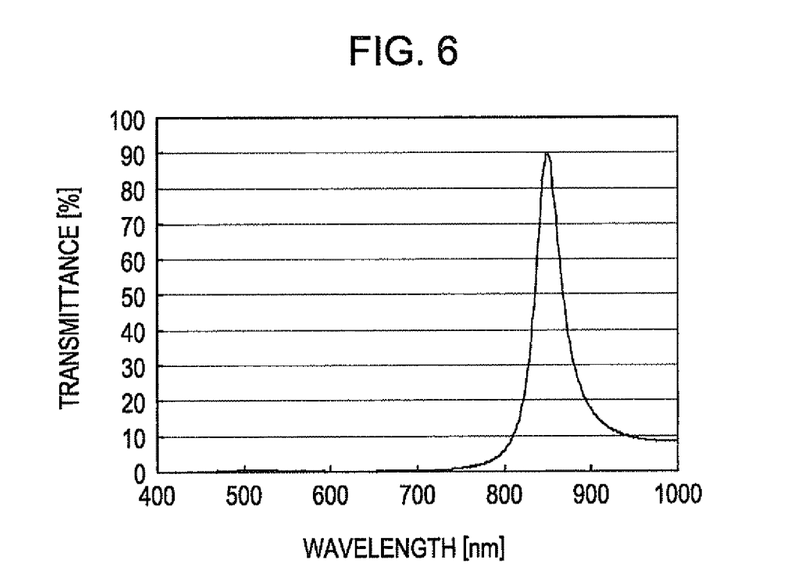
FIG. 6 is a view which shows a wavelength and transmittance characteristics of a band pass filter according to a third embodiment.

FIG. 6 is a diagram which shows the wavelength and the transmittance characteristics of the band pass filter which is used in the embodiment. As shown in the drawing, the emission peak wavelength ($\lambda$) 850 nm of the light source 13 and the transmission peak wavelength of the band pass filter 33 match each other. For this reason, it is possible to obtain the same effects as those of the first and second embodiments, that is, it is possible to suppress the deterioration of the intensity of input light to the light receiving elements 38 due to the presence of the band pass filter 33, when photographing the vein patterns using the light source 13. Therefore, it is possible to photograph the vein patterns using the light source 13 as lighting in a room or the like.

In addition, similarly to the first and second embodiments, the band pass filter 33 according to the embodiment also includes the a-Si thin film 41 which has a large absorption in the visible range. Further, it is understood that the sub-transmission bands in the visible region can be further reliably suppressed compared to that in the first and second embodiments, in the sub-transmission bands (which appears at both sides of the transmission peak wavelength) which appear when configuring the band pass filter 33 with a single dielectric multilayer, by adjusting the film thickness of the a-Si thin film 41 and the $SiO_2$ thin film 42 as described above. Accordingly, it is possible to avoid the inconvenience in which the imaging unit 23 is saturated, the vein patterns become an overexposed image, and an authentication is disabled, when the finger is radiated to the sunlight. Due to this, in any case where the light source 13 is used as the lighting in a room or the like, or where the sunlight is radiated to the finger outside a room, it is possible to photograph further suitable vein patterns.

Fourth Embodiment

Biometric Authentication Device

Figure 7A:
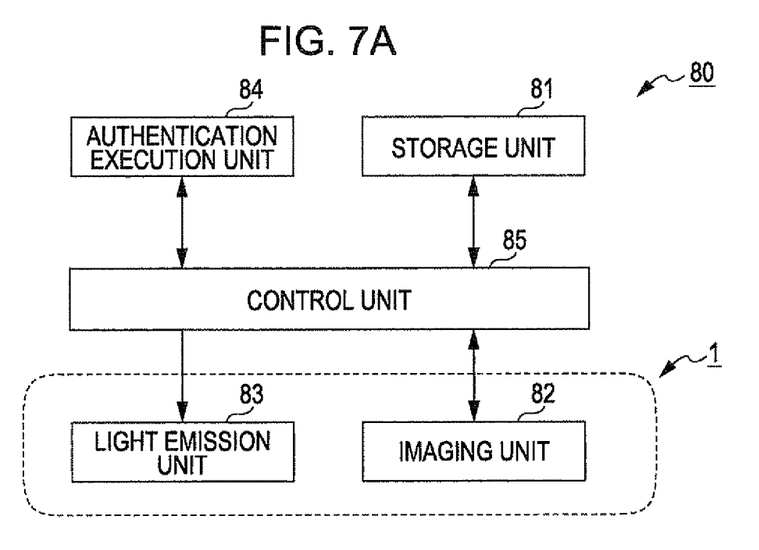

Subsequently, a biometric authentication device according to the embodiment will be described. FIG. 7A is a block diagram of a vein authentication device as the biometric authentication device. As shown in FIG. 7A, the vein authentication device 80 as the biometric authentication device includes a storage unit 81, an imaging unit 82, a light emission unit 83, an authentication execution unit 84, and a control unit 85. In addition, the vein authentication device 80 includes an image acquisition device 1. That is, the imaging unit 82 and the light emission unit 83 correspond to the image acquisition device 1, the imaging unit 82 corresponds to the image acquisition unit 12, and the light emission unit 83 corresponds to the light source 13, respectively.

The light emission unit 83 emits the near infrared light on the basis of a signal which is transmitted from the control unit 85. The imaging unit 82 starts photographing operation on the basis of the control signal which is transmitted from the control unit 85, and outputs an obtained vein pattern to the control unit 85.

The control unit 85 performs various processing such as calculation processing of the signal, or signal transmission on the basis of the program which is installed in the storage unit 81, and transmits the vein pattern which is output from the imaging unit 82 to the authentication execution unit 84.

The storage unit 81 is a storage device such as a hard disk, a semiconductor memory (DRAM (Dynamic Random Access Memory), or a SRAM (Static Random Access Memory)). In the storage unit 81, information such as a program for executing the biometric authentication, a program for executing an image configuration, vein patterns which is registered in advance and used in authentication, and authentication history are stored.

The authentication execution unit 84 executes the authentication on the basis of the vein patterns which are obtained and registered in advance. A detained method of authentication using the authentication execution unit 84 is arbitrary. The method of vein authentication depends on a variety of methods which determines the similarity.

Figure 7B:
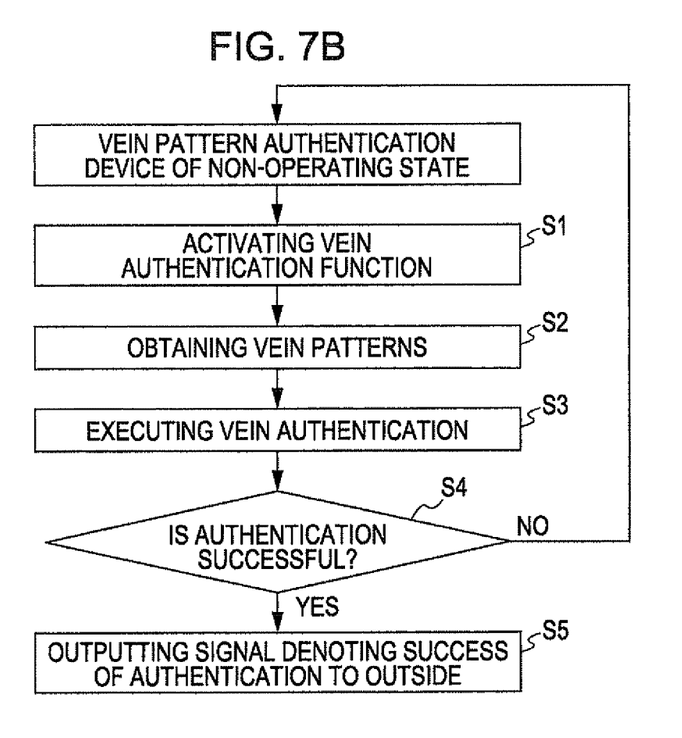
FIG. 7B is an operation explanation diagram of a vein authentication device as a biometric authentication device.

An operation of the vein authentication device 80 will be described with reference to FIG. 7B. First, the vein authentication device 80 is set to a non-operating state.

Subsequently, a function of the vein authentication of the vein authentication device 80 is activated (S1).

Subsequently, the vein authentication device 80 executes obtaining of the vein patterns (S2). That is, the control unit 85 set the imaging unit 82 in an operating state, and emits near infrared light from the light emission unit 83. In this manner, the vein patterns are obtained.

Subsequently, the authentication execution unit 84 executes the vein authentication on the basis of the vein patterns which are obtained from the imaging unit 82 and the vein patterns which are registered in advance (S3). In addition, the detailed method of the vein authentication is diverse according to a variety of technologies in image processing.

Finally, the authentication execution unit 84 determines whether or not the authentication is succeeded (S4). When the authentication is successful, the authentication execution unit 84 outputs a signal which denotes the success of authentication to the control unit 85. When the authentication is not successful, the authentication execution unit 84 outputs a signal which denotes an authentication failure to the control unit 85.

When authentication is successful, the control unit 85 outputs the signal of success of authentication to the outside (S5). In addition, when authentication is not successful, the vein authentication device 80 returns to the non-operating state.

As is clear from the above description, when executing the vein authentication, it is essential to obtain good vein patterns. The vein authentication device 80 is able to reliably execute the vein authentication in any environment, since the device includes the image acquisition device 1 which is able to photograph good vein patterns regardless of being inside or outside of a building.

Fifth Embodiment

Electronic Apparatus

Figure 8A:
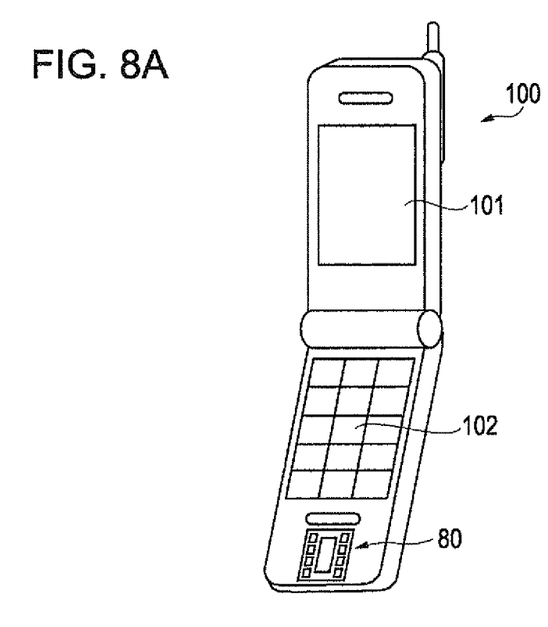
FIGS. 8A and 8B are perspective views of a mobile phone, and a mobile personal computer as electronic apparatus.

Subsequently, an example in which the vein authentication device 80 according to the above described embodiment is applied to the electronic apparatus will be described. FIG. 8A is a perspective view of a mobile phone as an electronic apparatus. The mobile phone 100 as the electronic apparatus according to the embodiment includes a display unit 101, an operation button 102, and a vein authentication device 80. The vein authentication device 80 is able to clear the lock state of the mobile phone 100, or perform the personal authentication when performing a financial payment, by performing personal authentication using the vein patterns which are obtained by the image acquisition device 1 which is built therein.

Since the mobile phone 100 includes a vein authentication device 80 having an image acquisition device 1 which is able to photograph vein patterns regardless of being inside or outside of a building, it is possible to perform the personal authentication in any environment.

Figure 8B:
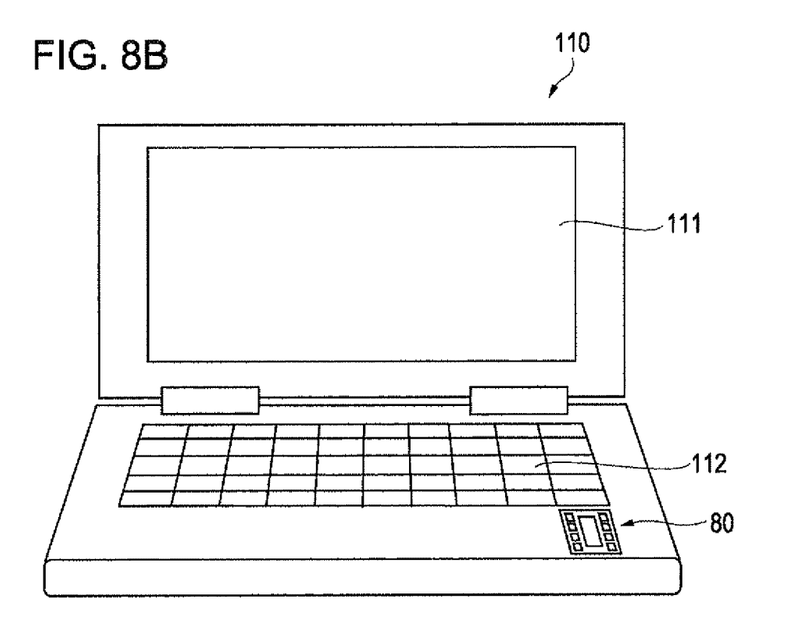

FIG. 8B is a perspective view of a mobile personal computer as an electronic apparatus. The mobile personal computer 110 as the electronic apparatus according to the embodiment includes a display unit 111, an input button 112, and the vein authentication device 80. The vein authentication device 80 is able to log in to the mobile personal computer 110, or perform the personal authentication when performing a financial payment, by executing personal authentication using the vein patterns which are obtained by the image acquisition device 1 which is built therein.

Since the mobile personal computer 110 includes the vein authentication device 80 having an image acquisition device 1 which is able to photograph vein patterns regardless of being inside or outside of a building, it is possible to perform the personal authentication in any environment.

In addition, the technical scope of the invention is not limited to each of the above described embodiments, and includes a variety of changes which may be added to the above described embodiment, without being departed from the scope of the invention. That is, detailed materials, configurations, or the like, which are exemplified in each embodiment are only examples, and can be appropriately changed.

For example, in the above described embodiment, as the band pass filter 33, the thin film laminated body which is configured by the a-Si thin film 41 and the $SiO_2$ thin film 42 was exemplified, however, it is possible to apply a material which is transparent to the near infrared light such as silicon nitride, and has a different refractivity from the a-Si to the band pass filter 33, instead of $SiO_2$.

According to the above described embodiment, the band pass filter 33 is provided between the transparent support medium 31 of the condensing unit 21 and the microlens 32, however, the band pass filter 33 may be provided at a side where the transparent support medium 31 of the condensing unit 21, and the microlens 32 are not formed.

In addition, the band pass filter 33 may be provided at a side where the light shielding layer 35 of the transparent support medium 34 of the light shielding unit 22 is not formed, may be provided between the transparent support medium 34 of the light shielding unit 22 and the light shielding layer 35, or may be provided in the light shielding layer 35, or on the opening 36.

Further, the band pass filter 33 may be provided on the light receiving elements 38 of the imaging unit 23.

The entire of Japanese Patent Application No. 2011-085162, filed Apr. 7, 2011 is expressly incorporated by reference herein.

What is claimed is:

1. An image acquisition device comprising:
   a light source which irradiates an object with light; and
   a band pass filter on a path on which the light from the object is input to light receiving elements, the band pass filter being configured by two mirror layers and a spacer layer, the spacer layer being pinched by the two mirror layers, each of the two mirror layers having a structure including amorphous silicon thin films and a thin film, the thin film being alternately laminated with an amorphous silicon thin film, each of the amorphous silicon thin films having an optical path length of approximately $\lambda/4$ in the peak wavelength ($\lambda$) of the light source, the thin film being formed of a material having a different refractivity from the amorphous silicon thin films, and the spacer layer being the amorphous silicon thin film which has an optical path length of approximately $\lambda/2$ in the peak wavelength ($\lambda$) of the light source, or a thin film which is formed of a material with a different refractivity from the amorphous silicon thin films.

2. An image acquisition device comprising:

a light source which irradiates an object with light; and a band pass filter on a path on which the light from the object is input to light receiving elements, the band pass filter being configured by two mirror layers and a spacer layer, the spacer layer being pinched by the two mirror layers, each of the two mirror layers having a structure including amorphous silicon thin films and a thin film, the thin film being alternately laminated with an amorphous silicon thin film, each of the amorphous silicon thin films having an optical path length of approximately $(\lambda 2)/4$ in a wavelength ($\lambda 2$), which is shorter than a peak wavelength ($\lambda$) of the light source, the thin film being formed of a material having a different refractivity from the amorphous silicon thin films, and the spacer layer comprising an amorphous silicon thin film which has an optical path length of approximately $(\lambda 3)/2$ in a wavelength ($\lambda 3$), which is longer than the peak wavelength ($\lambda$) of the light source, or a thin film which is formed of a material with a different refractivity from the amorphous silicon thin films.

3. An image acquisition device comprising:

a light source which irradiates an object with light;

a band pass filter on a path on which the light from the object is input to light receiving elements;

the band pass filter having a structure in which an amorphous silicon thin film and a thin film are alternately laminated by odd number layers ($2n+1$, $n=2, 3, \ldots$), the thin film being formed of a material having a different refractivity from the amorphous silicon thin film, and the optical path length of the band pass filter other than the $n+1$th layer is approximately $(\lambda 5)/4$ in a wavelength ($\lambda 5$) which is shorter than the peak wavelength ($\lambda$) of the light source, and the optical path length of the $n+1$th layer is smaller than the approximate $(\lambda 5)/4$ in the wavelength ($\lambda 5$), which is shorter than the peak wavelength ($\lambda$) of the light source.

4. A biometric authentication device which obtains human biological information, and performs personal authentication, comprising:

the image acquisition device according to claim 1.

5. A biometric authentication device which obtains human biological information, and performs personal authentication, comprising:

the image acquisition device according to claim 2.

6. A biometric authentication device which obtains human biological information, and performs personal authentication, comprising:

the image acquisition device according to claim 3.

7. An electronic apparatus comprising:

the biometric authentication device according to claim 4.

8. An electronic apparatus comprising:

the biometric authentication device according to claim 5.

* * * * *